(12) United States Patent
Itoh (10) Patent No.: US 7,479,365 B2
(45) Date of Patent: Jan. 20, 2009

(54) SEMICONDUCTOR DEVICE MANUFACTURING METHOD

(75) Inventor: Masamitsu Itoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/109,541

(22) Filed: Apr. 25, 2008

(65) Prior Publication Data

US 2008/0206657 A1    Aug. 28, 2008

Related U.S. Application Data

(62) Division of application No. 10/853,532, filed on May 26, 2004, now Pat. No. 7,384,713.

(30) Foreign Application Priority Data

May 30, 2003    (JP)    ............................. 2003-155936

(51) Int. Cl.
*G03F 7/20*    (2006.01)
*G03F 1/00*    (2006.01)

(52) U.S. Cl. .......................................... 430/311; 430/5

(58) Field of Classification Search ................. 430/311, 430/4–5
See application file for complete search history.

(56) References Cited

U.S. PATENT DOCUMENTS

| 6,537,844 | B1 * | 3/2003 | Itoh | ............................ 430/311 |
| 7,060,519 | B2 | 6/2006 | Itoh | |
| 7,097,946 | B2 | 8/2006 | Ito et al. | |
| 2002/0155361 | A1 | 10/2002 | Takeuchi et al. | |
| 2003/0186624 | A1 | 10/2003 | Koike et al. | |
| 2004/0253524 | A1 | 12/2004 | Itoh | |
| 2005/0244726 | A1 | 11/2005 | Itoh | |
| 2006/0024591 | A1 | 2/2006 | Itoh | |

FOREIGN PATENT DOCUMENTS

DE    10314212 A1    11/2003

OTHER PUBLICATIONS

Official Action from the German Patent and Trademark Office dated Mar. 14, 2007, in counterpart German Patent Application No. 10 2004 026 206.3-51.

* cited by examiner

*Primary Examiner*—Mark F Huff
*Assistant Examiner*—John Ruggles
(74) *Attorney, Agent, or Firm*—Finnegan, Henderson, Farabow, Garrett & Dunner, L.L.P.

(57) ABSTRACT

A method of manufacturing a semiconductor device by forming an exposure mask blank including a substrate and a light-shielding film formed thereon, comprising measuring a first flatness of each of a plurality of substrates before formation of a light-shielding film, predicting, on the basis of the first flatness, a second flatness of each substrate when chucked on an exposure apparatus, selecting from the plurality of substrates, at least one substrate having a predetermined flatness on the basis of the second flatness, predicting a desired third flatness of the at least one substrate after a light-shielding film is formed on the substrate, forming a light-shielding film on the selected at least one substrate, measuring a fourth flatness of the at least one substrate having the formed light-shielding film, determining whether the at least one substrate having the light-shielding film has the desired third flatness by comparing the fourth flatness with the third flatness, then patterning an exposure mask, chucking it in the exposure apparatus, and transferring an image onto a predetermined substrate.

6 Claims, 2 Drawing Sheets

SEMICONDUCTOR DEVICE MANUFACTURING METHOD

CROSS-REFERENCE TO RELATED APPLICATIONS

This application is a division of U.S. application Ser. No. 10/853,532, filed May 26, 2004, now U.S. Pat. No. 7,384,713 issued Jun. 10, 2008, which is based upon and claims the benefit of priority from prior Japanese Patent Application No. 2003-155936, filed May 30, 2003. The entire contents of these applications are incorporated herein by reference in their entirety.

BACKGROUND OF THE INVENTION

1. Field of the Invention

The present invention relates to an exposure mask substrate manufacturing method, an exposure mask manufacturing method, and a semiconductor device manufacturing method.

2. Description of the Related Art

In recent years, problems in photolithography in the semiconductor manufacturing process have become noticeable. Along with the progress in size reduction of semiconductor devices, the need for micropatterning in photolithography has grown. The device design rule has already been reduced to 0.1 µm, and the pattern size to be controlled is 10 nm or less. That is, the accuracy required is very strict.

Under these circumstances, the problem of flatness of photomasks used in photolithography has risen as a factor that impedes highly accurate pattern formation. As the focus margin in photolithography decreases along with size reduction of devices, the flatness of a photomask has become non-negligible.

When the shape of a photomask chucked in an exposure apparatus is predicted by simulation, the flatness of the photomask can be managed in actual use. Hence, the number of problems caused by the flatness of photomasks is becoming smaller than before where the flatness is not predicted.

However, there is still a problem that a photomask shape predicted by simulation does not coincide with the shape of a photomask actually chucked in an exposure apparatus. This is because a light-shielding film formed on the photomask has internal stress. In a photomask having a pattern with a large opening ratio, stress relief caused by removing the light-shielding film by etching changes the flatness of the mask.

BRIEF SUMMARY OF THE INVENTION

According to an aspect of the invention, there is provided a method of manufacturing an exposure mask substrate including a substrate and a light-shielding film formed on the substrate, comprising: measuring a flatness of at least one substrate before formation of a light-shielding film; predicting, on the basis of a measurement result, the flatness of the substrate when the substrate is chucked on an exposure apparatus; selecting the substrate having a predetermined flatness on the basis of a prediction result; predicting, for the selected substrate, a desired flatness of the substrate after light-shielding film formation after a light-shielding film is formed on the substrate; forming a light-shielding film on the selected substrate; measuring the flatness of the substrate having the formed light-shielding film; and determining whether the substrate having the light-shielding film has the desired flatness after light-shielding film formation by comparing a measurement result with a prediction result of the flatness after light-shielding film formation.

According to another aspect of the invention, there is provided a method of manufacturing an exposure mask substrate including a substrate and a light-shielding film formed on the substrate, comprising: measuring a flatness of at least one substrate before formation of a light-shielding film; predicting, on the basis of a measurement result, the flatness of the substrate when the substrate is chucked on an exposure apparatus; selecting the substrate having a predetermined first flatness on the basis of a prediction result; forming a light-shielding film on the selected substrate; measuring the flatness of the substrate after light-shielding film formation, the substrate having the formed light-shielding film; predicting, on the basis of a measurement result, the flatness of the substrate when the substrate after formation of the light-shielding film is chucked on the exposure apparatus; and selecting the substrate having a predetermined second flatness on the basis of a prediction result.

According to another aspect of the invention, there is provided an exposure mask manufacturing method of manufacturing an exposure mask by using an exposure mask substrate including a substrate and a light-shielding film formed on the substrate, comprising: measuring a flatness of at least one substrate before formation of a light-shielding film; predicting, on the basis of a measurement result, the flatness of the substrate when the substrate is chucked on an exposure apparatus; selecting the substrate having a predetermined flatness on the basis of a prediction result; predicting, for the selected substrate, a desired flatness of the substrate after light-shielding film formation after a light-shielding film is formed on the substrate; forming a light-shielding film on the selected substrate; measuring the flatness of the substrate having the formed light-shielding film; and manufacturing an exposure mask by forming a desired pattern on the substrate when it is determined by comparing a measurement result with a prediction result of the flatness after light-shielding film formation that the substrate having the light-shielding film has the desired flatness after light-shielding film formation.

According to another aspect of the invention, there is provided an exposure mask manufacturing method of manufacturing an exposure mask by using an exposure mask substrate including a substrate and a light-shielding film formed on the substrate, comprising: measuring a flatness of at least one substrate before formation of a light-shielding film; predicting, on the basis of a measurement result, the flatness of the substrate when the substrate is chucked on an exposure apparatus; selecting the substrate having a predetermined first flatness on the basis of a prediction result; forming a light-shielding film on the selected substrate; measuring the flatness of the substrate after light-shielding film formation, the substrate having the formed light-shielding film; predicting, on the basis of a measurement result, the flatness of the substrate when the substrate after formation of the light-shielding film is chucked on the exposure apparatus; selecting the substrate having a predetermined second flatness on the basis of a prediction result; and manufacturing an exposure mask by forming a desired pattern on the selected substrate.

According to another aspect of the invention, there is provided a semiconductor device manufacturing method comprising: chucking an exposure mask manufactured by the exposure mask manufacturing method in an exposure apparatus; and illuminating a pattern formed on the exposure mask, which is to be used to form a semiconductor element, by an illumination optical system to transfer an image of the pattern onto a predetermined substrate.

DETAILED DESCRIPTION OF THE INVENTION

The embodiments of the present invention will be described below with reference to the accompanying drawing.

The outline of the first embodiment includes a first measurement step of measuring the major surface flatness of a quartz substrate before formation of a light-shielding film including a Cr film and a halftone (HT) film, a step of simulating the major surface flatness after formation of the light-shielding film, which makes it possible to obtain a desired major surface flatness when a substrate prepared by forming the light-shielding film on the quartz substrate is chucked on the mask stage of an exposure apparatus, a second measurement step of measuring the major surface flatness of the substrate after the light-shielding film is actually formed on the quartz substrate, and a step of comparing the result in the second measurement step with the simulation result to determine whether the desired flatness can be obtained.

Figure 1:
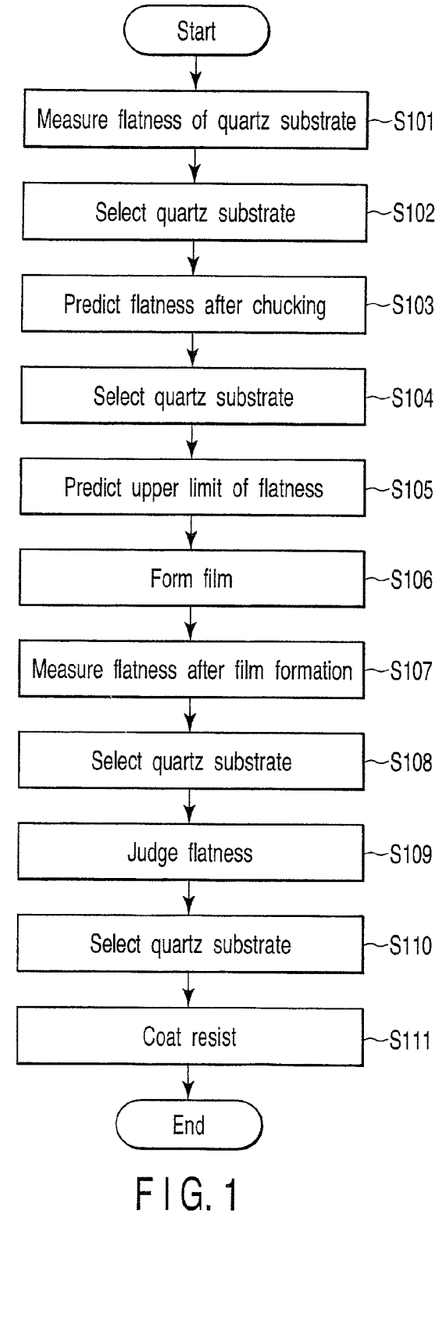
FIG. 1 is a flowchart showing an exposure mask substrate manufacturing step according to the first embodiment of the present invention.

FIG. 1 is a flowchart showing an exposure mask substrate (mask blank) manufacturing step according to the first embodiment of the present invention. The exposure mask substrate manufacturing step according to the first embodiment will be described below with reference to FIG. 1 and Tables 1 and 2 (described later).

Table 1 shows the results of flatness measurement and prediction of 10 quartz substrates (glass substrates) (A to J). Each quartz substrate is 6 inches square (152 mm square) and has a thickness of about 6 mm.

TABLE 1

Flatness of Quartz Substrate (μm)

| Substrate | Mask Major Surface Measurement Data as 148 mm Square Region Shape | Mask Major Surface Measurement Data as 132 mm Square Region Flatness | Flatness in 132 mm Square Region in Chuck Simulation |
|---|---|---|---|
| A | convex | 0.3 | 0.1 |
| B | convex | 0.2 | 0.2 |
| C | convex | 0.2 | 0.1 |
| D | convex | 0.3 | 0.0 |
| E | convex | 0.1 | 0.2 |
| F | convex | 0.2 | 0.1 |
| G | concave, NG | | |
| H | convex | 0.2 | 0.2 |
| I | convex | 0.3 | 0.4, NG |
| J | convex | 0.5, NG | |

First, in step S101, the major surface flatness in a 148 mm square region of each of the quartz substrates (A to J) was measured. UltraFlat available from Tropel was used as a flatness measuring apparatus. In step S102, of the 10 quartz substrates (A to J) which underwent flatness measurement, nine quartz substrates (A to F, and H to J) for which the flatness in the 148 mm square region indicated a convex shape (the mask central portion was higher than the mask peripheral portion) were selected. In addition, of the nine quartz substrates, eight quartz substrates (A to F, H, and I) for which the flatness in a 132 mm square region at the central portion of the substrate major surface fell within the range of 0.3 μm or less were selected.

The reason why the eight quartz substrates for which the flatness in the 132 mm square region at the central portion of the substrate major surface fell within the range of 0.3 μm or less were selected first is as follows. In a quartz substrate whose flatness before chucking (vacuum chucking) in an exposure apparatus exceeds 0.3 μm, the positional distortion of the mask pattern becomes large even though a desired flatness is obtained after chucking in the exposure apparatus.

In step S103, for each of the eight quartz substrates (A to F, H and I), the flatness when the quartz substrate was chucked on the mask stage of an exposure apparatus was predicted by simulation using a computer (not shown). In step S104, of the eight quartz substrates, seven quartz substrates (A to F and H) for which the flatness in the 132 mm square region at the central portion of the substrate major surface after chucking fell within the range of 0.3 μm or less were selected on the basis of the prediction result.

Table 2 shows the results of flatness prediction and measurement of the seven selected quartz substrates (A to F and H) after formation of a light-shielding film.

TABLE 2

Flatness of Quartz Substrate with Light-Shielding Film (μm)

| Substrate | Upper Limit of Substrate Major Surface Flatness Predicted by Simulation as 148 mm Square Region Flatness | Mask Major Surface Measurement Data as 132 mm Square Region Flatness | Consistency With Upper Limit of Substrate Major Surface Flatness Predicted By Simulation (Measured Flatness in 148 mm Square Region and Determination Result) |
|---|---|---|---|
| A | 0.4 | 0.3 | 0.4 |
| B | 0.5 | 0.2 | 0.4 |
| C | 0.3 | 0.2 | 0.5, NG |
| D | 0.4 | 0.4, NG | |
| E | 0.4 | 0.1 | 0.2 |
| F | 0.3 | 0.2 | 0.3 |
| G | | | |
| H | 0.4 | 0.2 | 0.5, NG |
| I | | | |
| J | | | |

In step S105, for each of the seven quartz substrates (A to F and H), the upper limit of the flatness in the 148 mm square region of the substrate major surface after formation of the light-shielding film was predicted by simulation using a computer (not shown). This upper limit represents a condition which ensures that when the light-shielding film is formed on the quartz substrate, and the substrate is chucked on the mask stage, the flatness in the 132 mm square region at the central portion of the substrate major surface falls within the range of 0.3 μm or less. That is, a desired flatness of the substrate after formation of the light-shielding film falls within the range equal to or less than the upper limit.

In step S106, for each of the above-described seven quartz substrates (A to F and H), an HT film made of MoSiON was formed on the substrate major surface, and a Cr film was formed on the HT film. In step S107, the flatness in the 148 mm square region of the major surface of each substrate was measured. In step S108, of the seven quartz substrates (A to F and H), six quartz substrates (A to C, E, F, and H) for which the flatness in the 132 mm square region at the central portion of the substrate major surface fell within the range of 0.3 μm or less were selected on the basis of the measurement result.

In step S109, for each of the six quartz substrates (A to C, E, F, and H), the flatness measurement result after film formation was compared with the prediction result by the simulation to determine whether the flatness in the 148 mm square region of the substrate major surface was equal to or less than the above-described upper limit obtained by the simulation. In step S110, of the six quartz substrates (A to C, E, F, and H), four quartz substrates (A, B, E, and F) for which the flatness was equal to or less than the upper limit were selected on the basis of the determination result. The four quartz substrates were considered to be able to obtain a desired flatness after chucking because the major surface flatness was equal to or less than the above-described upper limit obtained by the simulation.

In step S111, an electron beam exposure resist was coated on the four quartz substrates (A, B, E, and F) to prepare the quartz substrates as exposure mask substrates.

The reason why the six quartz substrates for which the flatness in the 132 mm square region at the central portion of the substrate major surface fell within the range of 0.3 μm or less were selected first is as follows. In a quartz substrate whose flatness before chucking in the exposure apparatus exceeds 0.3 μm, the positional distortion of the mask pattern after chucking in the exposure apparatus becomes large even though a desired flatness is obtained after chucking in the exposure apparatus.

Subsequently, an exposure mask manufacturing step was executed. First, four patterns having different opening ratios were drawn on the above-described four exposure mask substrates by an electron beam lithography apparatus (EBM4000 available from NFT). Then, the substrates were baked and developed. The Cr film and HT film were etched by a reactive ion etching (RIE) apparatus (VLR-G3 available from UNAXIS). The remaining resist was removed. The Cr film on the HT film was removed by wet etching. Four HT masks having different opening ratios were thus formed. The opening ratios of the four exposure masks were 50%, 40%, 70%, and 95%.

The flatness of each exposure mask was measured while keeping it chucked on the mask stage of a wafer exposure apparatus. As a result, the flatness after chucking was 0.3 μm or less in each exposure mask, which satisfied the target value. Accordingly, a sufficient focal depth can be obtained in photolithography in semiconductor device manufacturing, and the yield of semiconductor device manufacturing can greatly be increased.

The outline of the second embodiment includes a first measurement step of measuring the major surface flatness of a quartz substrate before formation of a light-shielding film including a Cr film and a halftone (HT) film, a first simulation step of simulating the major surface flatness when the quartz substrate is chucked on the mask stage of an exposure apparatus, a step of determining on the basis of the result in the first simulation step whether a desired major surface flatness can be obtained when the quartz substrate is chucked on the mask stage of the exposure apparatus, a light-shielding film formation step of forming a light-shielding film on the quartz substrate for which it is determined in the determination step that the desired major surface flatness can be obtained, a second measurement step of measuring the major surface flatness of the substrate with the light-shielding film, a second simulation step of simulating, on the basis of the result in the second measurement step, the major surface flatness when the substrate with the light-shielding film is chucked on the mask stage of the exposure apparatus, and a determination step of determining on the basis of the result in the second simulation step whether a desired flatness can be obtained when the substrate with the light-shielding film is chucked on the mask stage of the exposure apparatus.

Figure 2:
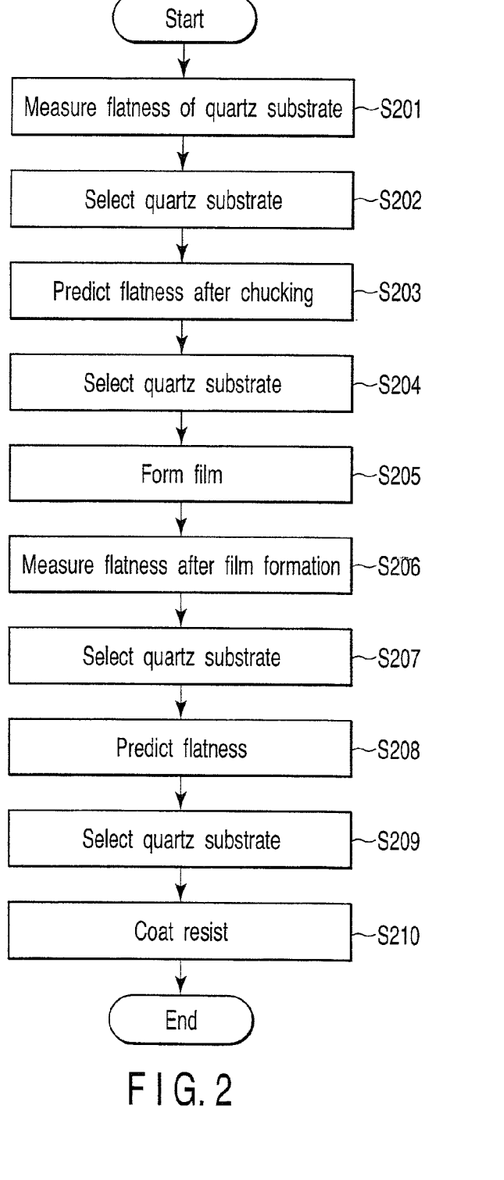
FIG. 2 is a flowchart showing an exposure mask substrate manufacturing step according to the second embodiment of the present invention.

FIG. 2 is a flowchart showing an exposure mask substrate manufacturing step according to the second embodiment of the present invention. The exposure mask substrate manufacturing step according to the second embodiment will be described below with reference to FIG. 2 and Tables 3 and 4 (described later).

Table 3 shows the results of flatness measurement and prediction of 10 quartz substrates (K to T). Each quartz substrate is 6 inches square (152 mm square) and has a thickness of about 6 mm.

TABLE 3

Flatness of Quartz Substrate (μm)

| Substrate | Mask Major Surface Measurement Data as 148 mm Square Region Shape | Mask Major Surface Measurement Data as 132 mm Square Region Flatness | Flatness in 132 mm Square Region in Chuck Simulation |
|---|---|---|---|
| K | convex | 0.3 | 0.1 |
| L | convex | 0.2 | 0.2 |
| M | concave, NG | | |
| N | convex | 0.3 | 0.0 |
| O | convex | 0.5, NG | |
| P | convex | 0.2 | 0.1 |
| Q | convex | 0.2 | 0.4, NG |
| R | convex | 0.2 | 0.2 |
| S | convex | 0.3 | 0.4, NG |
| T | convex | 0.2 | 0.1 |

First, in step S201, the major surface flatness in a 148 mm square region of each of the quartz substrates (K to T) was measured. UltraFlat available from Tropel was used as a flatness measuring apparatus. In step S202, of the 10 quartz substrates (K to T) which underwent flatness measurement, nine quartz substrates (K, L, and N to T) for which the flatness in the 148 mm square region indicated a convex shape (the mask central portion was higher than the mask peripheral portion) were selected. In addition, of the nine quartz substrates, eight quartz substrates (K, L, N, and P to T) for which the flatness in a 132 mm square region at the central portion of the substrate major surface fell within the range of 0.3 μm or less were selected.

The reason why the eight quartz substrates for which the flatness in the 132 mm square region at the central portion of the substrate major surface fell within the range of 0.3 μm or less were selected first is as follows. In a quartz substrate whose flatness before chucking (vacuum chucking) in an exposure apparatus exceeds 0.3 μm, the positional distortion of the mask pattern becomes large even though a desired flatness is obtained after chucking in the exposure apparatus.

In step S203, for each of the eight quartz substrates (K, L, N, and P to T), the flatness when the quartz substrate was chucked on the mask stage of an exposure apparatus was predicted by simulation using a computer (not shown). In step S204, of the eight quartz substrates, six quartz substrates (K, L, N, P, R, and T) for which the flatness in the 132 mm square region at the central portion of the substrate major surface after chucking fell within the range of 0.3 μm or less were selected on the basis of the prediction result.

Table 4 shows the results of flatness measurement and prediction of the six selected quartz substrates (K, L, N, P, R, and T) after formation of a light-shielding film.

TABLE 4

Flatness of Quartz Substrate with Light-Shielding Film (μm)

| Substrate | Mask Major Surface Measurement Date as 132 mm Square Region Flatness | Flatness in 132 mm Square Region in Chuck Simulation |
|---|---|---|
| K | 0.2 | 0.3 |
| L | 0.3 | 0.2 |
| M | | |
| N | 0.4 | |
| O | | |
| P | 0.3 | 0.4, NG |
| Q | | |
| R | 0.2 | 0.5, NG |
| S | | |
| T | 0.1 | 0.1 |

In step S205, for each of the above-described six quartz substrates (K, L, N, P, R, and T), an HT film made of MoSiON was formed on the substrate major surface, and a Cr film was formed on the HT film. In step S206, the flatness in the 148 mm square region of the major surface of each substrate was measured. In step S207, of the six quartz substrates (K, L, N, P, R, and T), five quartz substrates (K, L, P, R, and T) for which the flatness in the 132 mm square region at the central portion of the substrate major surface fell within the range of 0.3 μm or less were selected on the basis of the measurement result.

In step S208, for each of the five quartz substrates (K, L, P, R, and T), the flatness when the quartz substrate was chucked on the mask stage of the exposure apparatus was predicted by simulation using a computer (not shown). In step S209, of the five quartz substrates, three quartz substrates (K, L, and T) for which the flatness in the 132 mm square region at the central portion of the substrate major surface after chucking fell within the range of 0.3 μm or less were selected on the basis of the prediction result.

In step S210, an electron beam exposure resist was coated on the three quartz substrates (K, L, and T) to prepare the quartz substrates as exposure mask substrates.

The reason why the five quartz substrates for which the flatness in the 132 mm square region at the central portion of the substrate major surface fell within the range of 0.3 μm or less were selected first is as follows. In a quartz substrate whose flatness before chucking in the exposure apparatus exceeds 0.3 μm, the positional distortion of the mask pattern after chucking in the exposure apparatus becomes large even though a desired flatness is obtained after chucking in the exposure apparatus.

Subsequently, an exposure mask manufacturing step was executed. First, three patterns having different opening ratios were drawn on the above-described three exposure mask substrates by an electron beam lithography apparatus (EBM4000 available from NFT). Then, the substrates were baked and developed. The Cr film and HT film were etched by a reactive ion etching (RIE) apparatus (VLR-G3 available from UNAXIS). The remaining resist was removed. The Cr film on the HT film was removed by wet etching. Three HT masks having different opening ratios were thus formed. The opening ratios of the three exposure masks were 50%, 50%, and 95%.

The flatness of each exposure mask was measured while keeping it chucked on the mask stage of a wafer exposure apparatus. As a result, the flatness after chucking was 0.3 μm or less in each exposure mask, which satisfied the target value. Accordingly, a sufficient focal depth can be obtained in photolithography in semiconductor device manufacturing, and the yield of semiconductor device manufacturing can greatly be increased.

The outline of the third embodiment includes a first measurement step of measuring the major surface flatness of a quartz substrate before formation of a light-shielding film including a Cr film and a halftone (HT) film, a step of simulating the major surface flatness after formation of the light-shielding film, which makes it possible to obtain a desired major surface flatness when a substrate prepared by forming the light-shielding film on the quartz substrate at a desired coverage is chucked on the mask stage of an exposure apparatus, a second measurement step of measuring the major surface flatness of the substrate after the light-shielding film is actually formed on the quartz substrate, and a step of comparing the result in the second measurement step with the simulation result to determine whether the desired flatness can be obtained.

Figure 3:
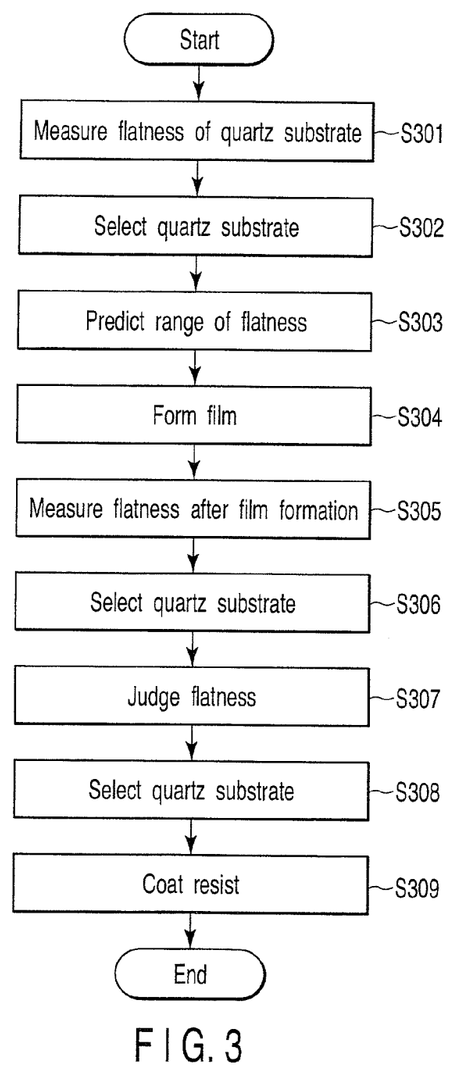
FIG. 3 is a flowchart showing an exposure mask substrate manufacturing step according to the third embodiment of the present invention.

FIG. 3 is a flowchart showing an exposure mask substrate manufacturing step according to the third embodiment of the present invention. The exposure mask substrate manufacturing step according to the third embodiment will be described below with reference to FIG. 3 and Tables 5 and 6 (described later).

Table 5 shows the results of flatness measurement and prediction of 10 quartz substrates (A to J). Each quartz substrate is 6 inches square (152 mm square) and has a thickness of about 6 mm.

TABLE 5

Flatness of Quartz Substrate (μm)

| Substrate | Mask Major Surface Measurement Data as 148 mm Square Region Shape | Mask Major Surface Measurement Data as 132 mm Square Region Flatness |
|---|---|---|
| A | convex | 0.3 |
| B | convex | 0.2 |
| C | convex | 0.2 |
| D | convex | 0.3 |
| E | convex | 0.1 |
| F | convex | 0.2 |
| G | convex | 0.3 |
| H | convex | 0.2 |
| I | convex | 0.3 |
| J | convex | 0.5, NG |

First, in step S301, the major surface flatness in a 148 mm square region of each of the quartz substrates (A to J) was measured. UltraFlat available from Tropel was used as a flatness measuring apparatus. In step S302, of the 10 quartz substrates (A to J) which underwent flatness measurement, 10 quartz substrates (A to J) for which the flatness in the 148 mm square region indicated a convex shape (the mask central portion was higher than the mask peripheral portion) were selected. In addition, of the 10 quartz substrates, nine quartz substrates (A to I) for which the flatness in a 132 mm square region at the central portion of the substrate major surface fell within the range of 0.3 μm or less were selected.

The reason why the nine quartz substrates for which the flatness in the 132 mm square region at the central portion of the substrate major surface fell within the range of 0.3 μm or less were selected first is as follows. In a quartz substrate whose flatness before chucking (vacuum chucking) in an exposure apparatus exceeds 0.3 μm, the positional distortion of the mask pattern becomes large even though the desired flatness is obtained after chucking in the exposure apparatus.

Table 6 shows the results of flatness prediction and measurement of the nine selected quartz substrates (A to I) after formation of a light-shielding film.

TABLE 6

Flatness of Quartz Substrate with Light-Shielding Film (μm)

| Substrate | Range of Substrate Major Surface Flatness Predicted by Simulation (Coverage: 50 to 100%) in 148 mm Square Region | Mask Major Surface Measurement Data as 148 mm Square Region Flatness | Consistency with Substrate Major Surface Flatness Predicted by Simulation |
|---|---|---|---|
| A | 0.2-0.4 | 0.3 | OK |
| B | 0.1-0.3 | 0.2 | OK |
| C | 0.1-0.3 | 0.2 | OK |
| D | 0.2-0.4 | 0.5 | NG |
| E | 0-0.2 | 0.1 | OK |
| F | 0.1-0.3 | 0.2 | OK |
| G | 0.2-0.4 | 0.4 | OK |
| H | 0.1-0.3 | 0.2 | OK |
| I | 0.2-0.4 | -0.1 | NG |
| J | | | |

In step S303, for each of the nine quartz substrates (A to I), the range of the flatness in the 148 mm square region of the substrate major surface after the light-shielding film was formed on the substrate major surface was predicted by simulation using a computer (not shown). This range represents a condition which ensures that when the light-shielding film is formed on the quartz substrate at a coverage of 50 to 100%, and the substrate is chucked on the mask stage, the flatness in the 132 mm square region at the central portion of the substrate major surface falls within the range of 0.3 μm or less. That is, a desired flatness of the substrate after formation of the light-shielding film falls within the range.

In step S304, for each of the above-described nine quartz substrates (A to I), an HT film made of MoSiON was formed on the substrate major surface, and a Cr film was formed on the HT film. In step S305, the flatness in the 148 mm square region of the major surface of each substrate was measured. In step S306, of the nine quartz substrates (A to I), nine quartz substrates (A to I) for which the flatness in the 132 mm square region at the central portion of the substrate major surface fell within the range of 0.3 μm or less were selected on the basis of the measurement result.

In step S307, for each of the nine quartz substrates (A to I), the flatness measurement result after film formation was compared with the prediction result by the simulation to determine whether the flatness in the 148 mm square region of the substrate major surface fell within the range obtained by the simulation. In step S308, of the nine quartz substrates (A to I), seven quartz substrates (A to C, and E to H) for which the flatness fell within the range were selected on the basis of the determination result. The seven quartz substrates were considered to be able to obtain a desired flatness after chucking because the major surface flatness fell within the above-described range obtained by the simulation.

In step S309, an electron beam exposure resist was coated on the seven quartz substrates (A to C, and E to H) to prepare the quartz substrates as exposure mask substrates.

The reason why the nine quartz substrates for which the flatness in the 132 mm square region at the central portion of the substrate major surface fell within the range of 0.3 μm or less were selected first is as follows. In a quartz substrate whose flatness before chucking in the exposure apparatus exceeds 0.3 μm, the positional distortion of the mask pattern after chucking in the exposure apparatus becomes large even though a desired flatness is obtained after chucking in the exposure apparatus.

Subsequently, an exposure mask manufacturing step was executed. First, three patterns having different opening ratios were drawn on three of the above-described seven exposure mask substrates by an electron beam lithography apparatus (EBM4000 available from NFT). Then, the substrates were baked and developed. The Cr film and HT film were etched by a reactive ion etching (RIE) apparatus (VLR-G3 available from UNAXIS). The remaining resist was removed. The Cr film on the HT film was removed by wet etching. Three HT masks having different opening ratios were thus formed. The opening ratios of the three exposure masks were 50%, 70%, and 95%.

The flatness of each exposure mask was measured while keeping it chucked on the mask stage of a wafer exposure apparatus. As a result, the flatness after chucking was 0.3 μm or less in each exposure mask, which satisfied the target value. Accordingly, a sufficient focal depth can be obtained in photolithography in semiconductor device manufacturing, and the yield of semiconductor device manufacturing can greatly be increased.

In the third embodiment, a desired light-shielding film coverage is 50 to 100%. If the light-shielding film coverage is 0 to 50%, i.e., includes 0%, the flatness of each quartz substrate chucked on the mask stage of the wafer exposure apparatus may be predicted first by simulation using the computer (not shown) on the basis of the flatness measurement result for the quartz substrate before formation of the light-shielding film. After chucking, quartz substrates for which the flatness in the 132 mm square region at the central portion of the substrate major surface equals the desired flatness are selected. Then, a light-shielding film may be formed on each quartz substrate.

The outline of the fourth embodiment includes a first measurement step of measuring the major surface flatness of a quartz substrate before formation of a light-shielding film including a Cr film and a halftone (HT) film, a first simulation step of simulating the major surface flatness when the quartz substrate is chucked on the mask stage of an exposure apparatus, a step of determining on the basis of the result in the first simulation step whether a desired major surface flatness can be obtained when the quartz substrate is chucked on the mask stage of the exposure apparatus, a light-shielding film formation step of forming a light-shielding film on the quartz substrate for which it is determined in the determination step that the desired major surface flatness can be obtained, a second measurement step of measuring the major surface flatness of the substrate with the light-shielding film, a second simulation step of simulating, on the basis of the result in the second measurement step, the major surface flatness when the substrate with the light-shielding film at a desired light-shielding film coverage is chucked on the mask stage of the exposure apparatus, and a determination step of determining on the basis of the result in the second simulation step whether the desired flatness can be obtained when the quartz substrate with the light-shielding film is chucked on the mask stage of the exposure apparatus.

Figure 4:
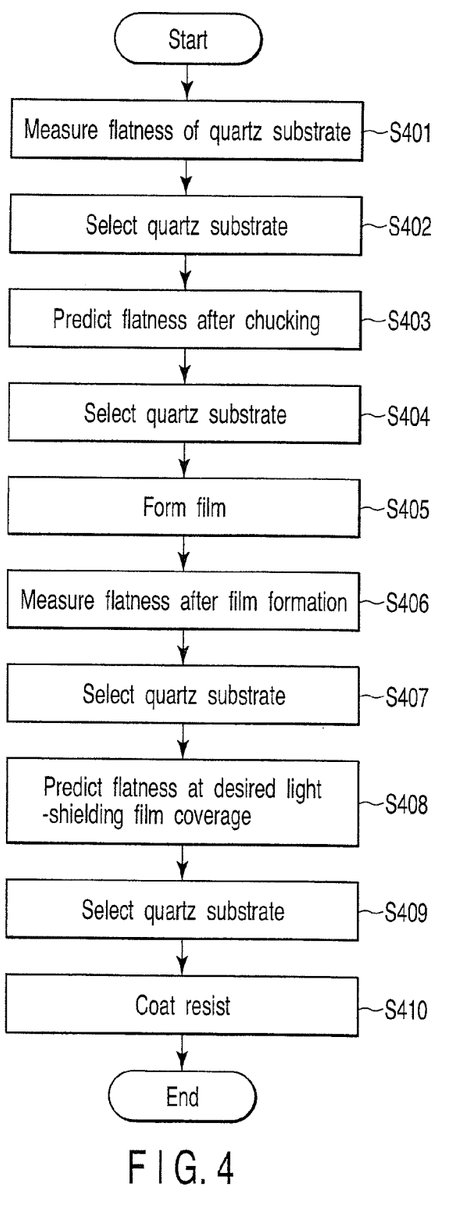
FIG. 4 is a flowchart showing an exposure mask substrate manufacturing step according to the fourth embodiment of the present invention.

FIG. 4 is a flowchart showing an exposure mask substrate manufacturing step according to the fourth embodiment of the present invention. The exposure mask substrate manufacturing step according to the fourth embodiment will be described below with reference to FIG. 4 and Tables 7 and 8 (described later).

Table 7 shows the results of flatness measurement and prediction of 10 quartz substrates (K to T). Each quartz substrate is 6 inches square (152 mm square) and has a thickness of about 6 mm.

TABLE 7

Flatness of Quartz Substrate (μm)

| Substrate | Mask Major Surface Measurement Data as 148 mm Square Region Shape | Mask Major Surface Measurement Data as 132 mm Square Region Flatness | Flatness in 132 mm Square Region in Chuck Simulation |
|---|---|---|---|
| K | convex | 0.3 | 0.1 |
| L | convex | 0.2 | 0.2 |
| M | concave, NG | | |
| N | convex | 0.3 | 0.0 |
| O | convex | 0.5, NG | |
| P | convex | 0.2 | 0.1 |
| Q | convex | 0.2 | 0.4, NG |
| R | convex | 0.2 | 0.2 |
| S | convex | 0.3 | 0.4, NG |
| T | convex | 0.2 | 0.1 |

First, in step S401, the major surface flatness in a 148 mm square region of each of the quartz substrates (K to T) was measured. UltraFlat available from Tropel was used as a flatness measuring apparatus. In step S402, of the 10 quartz substrates (K to T) which underwent flatness measurement, nine quartz substrates (K, L, and N to T) for which the flatness in the 148 mm square region indicated a convex shape (the mask central portion was higher than the mask peripheral portion) were selected. In addition, of the nine quartz substrates, eight quartz substrates (K, L, N, and P to T) for which the flatness in a 132 mm square region at the central portion of the substrate major surface fell within the range of 0.3 μm or less were selected.

The reason why the eight quartz substrates for which the flatness in the 132 mm square region at the central portion of the substrate major surface fell within the range of 0.3 μm or less were selected first is as follows. In a quartz substrate whose flatness before chucking (vacuum chucking) in an exposure apparatus exceeds 0.3 μm, the positional distortion of the mask pattern becomes large even though the desired flatness is obtained after chucking in the exposure apparatus.

In step S403, for each of the eight quartz substrates (K, L, N, and P to T), the flatness when the quartz substrate was chucked on the mask stage of an exposure apparatus was predicted by simulation using a computer (not shown). In step S404, of the eight quartz substrates, six quartz substrates (K, L, N, P, R, and T) for which the flatness in the 132 mm square region at the central portion of the substrate major surface after chucking fell within the range of 0.3 μm or less were selected on the basis of the prediction result.

Table 8 shows the results of flatness measurement and prediction of the six selected quartz substrates (K, L, N, P, R, and T) after formation of a light-shielding film.

TABLE 8

Flatness of Quartz Substrate with Light-Shielding Film (μm)

| Substrate | Mask Major Surface Measurement Data as 132 mm Square Region Flatness | Flatness in Chuck Simulation (Light-Shielding Film Coverage 0 to 50%) in 132 mm Square Region |
|---|---|---|
| K | 0.2 | 0.2-0.3 |
| L | 0.3 | 0.2-0.3 |
| M | | |
| N | 0.4 | |
| O | | |
| P | 0.3 | 0.2-0.3 |
| Q | | |
| R | 0.2 | 0.2 |
| S | | |
| T | 0.1 | 0.1-0.2 |

In step S405, for each of the above-described six quartz substrates (K, L, N, P, R, and T), an HT film made of MoSiON was formed on the substrate major surface, and a Cr film was formed on the HT film. In step S406, the flatness in the 148 mm square region of the major surface of each substrate was measured. In step S407, of the six quartz substrates (K, L, N, P, R, and T), five quartz substrates (K, L, P, R, and T) for which the flatness in the 132 mm square region at the central portion of the substrate major surface fell within the range of 0.3 μm or less were selected on the basis of the measurement result.

In step S408, for each of the five quartz substrates (K, L, P, R, and T), the flatness when the light-shielding film coverage was 0 to 50%, and the quartz substrate was chucked on the mask stage of the exposure apparatus was predicted by simulation using a computer (not shown). In step S409, of the five quartz substrates, five quartz substrates (K, L, P, R, and T) for which the flatness in the 132 mm square region at the central portion of the substrate major surface after chucking fell within the range of 0.3 μm or less were selected on the basis of the prediction result.

In step S410, an electron beam exposure resist was coated on the five quartz substrates (K, L, P, R, and T) to prepare the quartz substrates as exposure mask substrates.

The reason why the five quartz substrates for which the flatness in the 132 mm square region at the central portion of the substrate major surface fell within the range of 0.3 μm or less were selected first is as follows. In a quartz substrate whose flatness before chucking in the exposure apparatus exceeds 0.3 μm, the positional distortion of the mask pattern after chucking in the exposure apparatus becomes large even though the desired flatness is obtained after chucking in the exposure apparatus.

Subsequently, an exposure mask manufacturing step was executed. First, three patterns having different opening ratios were drawn on three of the above-described five exposure mask substrates by an electron beam lithography apparatus (EBM4000 available from NFT). Then, the substrates were baked and developed. The Cr film and HT film were etched by a reactive ion etching (RIE) apparatus (VLR-G3 available from UNAXIS). The remaining resist was removed. The Cr film on the HT film was removed by wet etching. Three HT masks having different opening ratios were thus formed. The opening ratios of the three exposure masks were 5%, 30%, and 50%.

The flatness of each exposure mask was measured while keeping it chucked on the mask stage of a wafer exposure apparatus. As a result, the flatness after chucking was 0.3 μm or less in each exposure mask, which satisfied the target value. Accordingly, a sufficient focal depth can be obtained in photolithography in semiconductor device manufacturing, and the yield of semiconductor device manufacturing can greatly be increased.

An exposure mask manufactured by using an exposure mask substrate manufactured by the exposure mask substrate manufacturing step described in each of the above embodiments is chucked in an exposure apparatus. A pattern formed on the exposure mask, which is to be used to form a semiconductor element, is illuminated by an illumination optical system to transfer the image of the pattern onto a predetermined substrate. With this processing, a semiconductor device can be manufactured.

As described above, according to the embodiments, flatness simulation after chucking is done on the basis of the substrate flatness measurement data before formation of a light-shielding film, and substrates having a desired flatness are selected. Next, the flatness after light-shielding film formation, which should ensure a desired flatness when a light-shielding film is formed on the substrate, is estimated. After a light-shielding film is actually formed on each substrate, it is determined whether the substrate satisfies the estimated flatness. Substrates that satisfy the flatness are used as exposure mask substrates. When a wafer is exposed by using an exposure mask manufactured by the above method, the focal tolerance can greatly and reliably be made larger than before.

The present invention is not limited to the above embodiments, and various changes and modifications can appropriately be made within the spirit and scope of the present invention. For example, the light-shielding film need not be limited to MoSiON or Cr. A Ta compound or a silicon nitride compound may also be used. The substrate need not be limited to a quartz substrate, either. A silicon substrate or an electron beam exposure mask substrate may be used.

In step S105 or S303, simulation can be executed to obtain a desired flatness assuming not only that the substrate is chucked on one kind of mask stage but also that the substrate is chucked on two or more kinds of mask stage.

According to one aspect of the present invention, an exposure mask substrate manufacturing method capable of manufacturing an exposure mask substrate having a desired flatness can be provided.

According to another aspect of the present invention, an exposure mask manufacturing method capable of manufacturing an exposure mask using an exposure mask substrate having a desired flatness can be provided.

According to still another aspect of the present invention, a semiconductor device manufacturing method capable of manufacturing a semiconductor device by using an exposure mask using an exposure mask substrate having a desired flatness can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:

measuring a first flatness of each of a plurality of exposure mask blank substrates before formation of a light-shielding film thereon;

predicting, on the basis of the first flatness, a second flatness of said each substrate when said each substrate is chucked on an exposure apparatus;

selecting, from the plurality of substrates, at least one substrate having a predetermined flatness on the basis of the second flatness;

predicting, for the selected at least one substrate, a desired third flatness of the at least one substrate after a light-shielding film is formed on the substrate;

forming a light-shielding film on the selected at least one substrate;

measuring a fourth flatness of the at least one substrate having the formed light-shielding film; and manufacturing an exposure mask by forming a desired pattern on the at least one substrate when it is determined, by comparing the fourth flatness with the third flatness, that the at least one substrate having the light-shielding film has the desired third flatness;

chucking the exposure mask in the exposure apparatus; and illuminating a pattern formed on the exposure mask, which is to be used to form a semiconductor element, by an illumination optical system to transfer an image of the pattern onto a predetermined substrate.

2. The semiconductor device manufacturing method of claim 1, wherein in predicting the third flatness after light-shielding film formation, the desired flatness of the at least one substrate after the light-shielding film is formed at a predetermined coverage is predicted, the predetermined coverage being a predetermined percentage of the substrate which is covered by the light-shielding film.

3. The semiconductor device manufacturing method of claim 1, wherein the desired third flatness is a flatness of the at least one substrate after light-shielding film formation, which ensures that when the at least one substrate is chucked on the exposure apparatus, a flatness in a central portion of a major surface of the at least one substrate is not more than a predetermined value.

4. The semiconductor device manufacturing method of claim 2, wherein the desired third flatness is a flatness of the at least one substrate after light-shielding film formation, which ensures that when the at least one substrate is chucked on the exposure apparatus, a flatness in a central portion of a major surface of the at least one substrate is not more than a predetermined value.

5. A semiconductor device manufacturing method comprising:

measuring a first flatness of each of a plurality exposure mask blank of substrates before formation of a light-shielding film thereon;

predicting, on the basis of the first flatness, a second flatness of said each substrate when said each substrate is chucked on an exposure apparatus;

selecting, from the plurality of substrates, at least one first substrate having a first predetermined flatness on the basis of the second flatness;

forming a light-shielding film on the selected at least one first substrate;

measuring a third flatness of the at least one first substrate, the at least one first substrate having the formed light-shielding film;

predicting, on the basis of the third flatness, a fourth flatness of the at least one first substrate when the at least one first substrate, after formation of the light-shielding film, is chucked on the exposure apparatus;

selecting, from the at least one first substrate, at least one second substrate having a predetermined second flatness on the basis of the fourth flatness; and manufacturing an exposure mask by forming a desired pattern on the selected at least one second substrate;

chucking the exposure mask in the exposure apparatus; and illuminating a pattern formed on the exposure mask, which is to be used to form a semiconductor element, by an illumination optical system to transfer an image of the pattern onto a predetermined substrate.

6. The semiconductor device manufacturing method of claim 5, wherein in predicting the fourth flatness after light-shielding film formation, the flatness of the at least one first substrate after the light-shielding film is formed at a predetermined coverage is predicted, the predetermined coverage being a predetermined percentage of the substrate which is covered by the light-shielding film.

* * * * *